Dec. 13, 1966 M. W. BROOKSBY 3,292,014
LOGIC CIRCUIT HAVING INDUCTIVE ELEMENTS TO IMPROVE SWITCHING SPEED
Filed Jan. 11, 1965
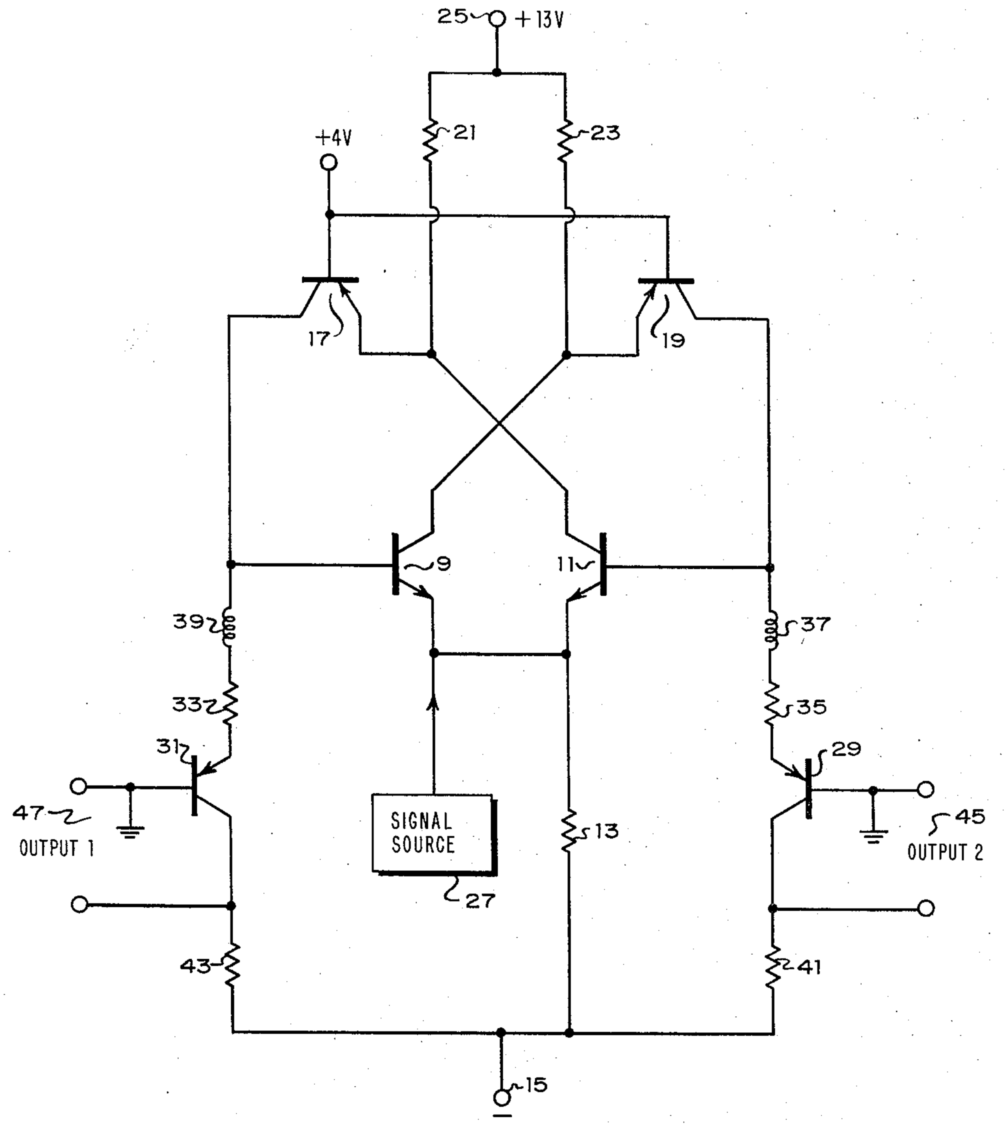
INVENTOR
MERRILL W. BROOKSBY
BY R. C. Smith
ATTORNEY United States Patent Office 3,292,014

Patented Dec. 13, 1966

3,292,014

LOGIC CIRCUIT HAVING INDUCTIVE ELEMENTS TO IMPROVE SWITCHING SPEED

Merrill W. Brooksby, Cupertino, Calif., assignor to Hewlett-Packard Company, Palo Alto, Calif., a corporation of California Filed Jan. 11, 1965, Ser. No. 424,796
6 Claims. (Cl. 307—88.5)

This invention relates to a high speed logic circuit.

It is an object of the present invention to provide a binary logic circuit which includes signal paths for cross coupling the output signal of one stage to the input of the other stage without attenuation or time delay.

It is another object of the present invention to provide an improved binary logic circuit which is capable of operating at very high frequencies.

In accordance with the illustrated embodiment of the present invention, the inputs and outputs of a pair of gain elements are cross coupled by signal paths which include low input impedance amplifiers. The outputs of these amplifiers supply switching currents to the inputs of the gain elements and to output loads connected to the inputs of the gain elements.

These and other objects of the present invention will be apparent from a reading of this specification and an inspection of the accompanying drawing which shows a schematic diagram of the circuit of the present invention.

In the drawing, there is shown a pair of transistors 9 and 11 having their emitters tied together and connected through resistor 13 to a source of voltage 15. The collectors of the transistors are connected to low input impedance amplifiers 17 and 19, the outputs of which are cross-connected to the inputs of transistors 9 and 11. Resistors 21 and 23 connected to power supply terminal 25 provide bias current for the common-base transistor amplifiers 17 and 19 and for transistors 9 and 11. Signals from source 27 are applied to the emitters of transistors 9 and 11 to alter the conduction of the one which is conductive in the operating cycle. Assuming initially that transistor 9 is conductive, a large portion of bias current through resistor 23 flows in transistor 9 and a small portion flows through transistor 19 to the base of transistor 11 and to the emitter of transistor 29. Also, since transistor 11 is nonconductive, all the bias current through resistor 21 flows through transistor 17 to the base of transistor 9 and to transistor 31. This high current produces a voltage drop across resistor 33 which appears as a positive voltage on the base of transistor 9 and which is greater than the positive voltage on the base of transistor 11 produced by the low current through resistor 35, thus maintaining transistor 9 conductive and transistor 11 nonconductive. An input signal of positive polarity (for transistors 9 and 11 of the conductivity type shown) from source 27 tends to cut off the conductive transistor 9. The change in its conductivity increases the portion portion of current which flows through transistor 19 to the base of transistor 11, thus establishing a high positive voltage drop across inductor 37. The increase in current through transistor 11 decreases the portion of current flowing through transistor 17 and inductor 39, thus establishing a high negative voltage drop which tends further to cut off transistor 9. The size of inductors 37 and 39 is so chosen that stored charge continues to flow in the inductors after the input pulse is removed but that currents in the inductors attain steady state values prior to the appearance of a successive input pulse.

The common-base transistor stages 17 and 19 prevent the voltages on the collector electrodes of transistors 9 and 11 from varying during changes in their conductivities, thus reducing materially the Miller-effect capacity between collector and base electrodes that affects switching time. Also, the low input impedance, common-base transistors 29 and 31 prevent the voltages on the collector electrodes of transistors 17 and 19 from varying (i.e. within the range of voltage change across inductors 37 and 39) during changes in conductivity, thus reducing the Miller-effect capacity between the base and collector electrodes. Thus, switch-time delaying storage elements are eliminated from the cross coupling paths between the transistors 9 and 11. The inductive storage elements 37 and 39 present a high impedance to switching transients and thus do not delay the switching time of the circuit. Rather, they are desirable as memory elements which store signal conditions relating to operation in a given stable state so that subsequent input pulses on a single input cause the bistable circuit to operate in alternate states as a binary logic circuit. Also, the inductors 37 and 39 isolate the transistor amplifiers 29, 31 and load resistors 41, 43 from the transistors 9, 11 during the switching time.

The common-base transistor amplifiers 29 and 31 show inductive reactances to applied signals, which reactances can be included in the inductors shown as lumped elements 37 and 39. Output signals related to the operating state of the binary logic circuit are provided at outputs 45 and 47 as the inductive transients decay.

Temperature compensation is provided by the symmetrical connections of the temperature-sensitive base-emitter junctions of transistors 17, 19, 29 and 31 to sources of reference potential. The voltage drops across these junctions tend to increase substantially equally with temperature, hence the operating conditions of the circuit remain unchanged over a wide range of operating temperatures.

I claim:

1. A logic circuit comprising:
a pair of gain elements, each including first and second electrodes forming an output circuit and including second and third electrodes forming an input circuit;
an input terminal connected to the input circuits of said gain elements for receiving a source of signal;
and for each of said gain elements;
a low input impedance amplifier connected to apply the signal at the output circuit of a gain element to the input circuit of the other gain element; and
inductive means connected to receive the signal applied to the input circuit of a gain element, said inductive means constituting the only energy storage means for storing energy at a level indicative of the most recent logic state.

2. A logic circuit as in claim 1 wherein:
said inductive means for each of said gain elements includes a device showing inductive reactance and another low input impedance amplifier serially connected to receive the signal applied to the input circuit of a gain element; and
means connected to the output of the last-named amplifier for providing an output signal related to the operating state of the logic circuit.

3. A logic circuit comprising:
a pair of gain elements, each including first and second electrodes forming an output circuit and including second and third electrodes forming an input circuit;
an input terminal connected to the input circuits of said gain elements for receiving a source of signal;
and for each of said gain elements;
a transistor amplifier connected in the common base configuration to apply the signal at the output circuit of a gain element to the input circuit of the other gain element;
a device showing inductive reactance;
another transistor amplifier connected in the common base configuration; and means serially connecting the device and the input of the other transistor amplifier for receiving the signal applied to the input circuit of a gain element.

4. A logic circuit as in claim 3 wherein:
each of said gain elements having first, second and third electrodes is a transistor having, respectively, collector, emitter and base electrodes; and
said source of signal is connected to the emitters of each of the last-named transistors.

5. A logic circuit comprising:
first and second transistors of one conductivity type having base, emitter and collector electrodes;
an input signal connected to the emitters of the first and second transistors for receiving a source of signal;
third and fourth transistors each of the opposite conductivity type having base, emitter and collector electrodes and being connected in the common base configuration;
a bias supply;
means connecting the collector of the first transistor and the emitter of the third transistor together and to said bias supply;
means connecting the collector of the second transistor and the emitter of the fourth transistor together and to the bias supply;
first and second networks having low input impedance;
a pair of inductive means, each serially connected to the input of one of the first and second networks;
means connecting the collector of the third transistor to the base of the second transistor and to the serially connected first network and one inductive means; and
means connecting the collector of the fourth transistor to the base of the first transistor and to the serially connected second network and other inductive means.

6. A logic circuit as in claim 5 wherein:
said bias supply biases the third and fourth transistors conductive for each operating state of the first and second transistors.

References Cited by the Examiner

UNITED STATES PATENTS

| | | | |
|---|---|---|---|
| 3,066,231 | 11/1962 | Slobodzinski et al. | 307—88.5 |
| 3,070,709 | 12/1962 | Slobodzinski | 307—88.5 |

ARTHUR GAUSS, *Primary Examiner.*

R. EPSTEIN, *Assistant Examiner.*